United States Patent
Sakagami et al.

(10) Patent No.: US 7,928,494 B2
(45) Date of Patent: Apr. 19, 2011

(54) SEMICONDUCTOR DEVICE (75) Inventors: Eiji Sakagami, Yokohama (JP); Makoto Nakashima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/570,767

(22) Filed: Sep. 30, 2009

(65) Prior Publication Data

US 2010/0019305 A1   Jan. 28, 2010

Related U.S. Application Data (63) Continuation of application No. 11/538,272, filed on Oct. 3, 2006, now Pat. No. 7,615,818.

(30) Foreign Application Priority Data

Oct. 4, 2005 (JP) ................. 2005-291231

(51) Int. Cl.
*H01L 29/76* (2006.01)
(52) U.S. Cl. ........ 257/314; 257/283; 257/315; 438/264; 438/296
(58) Field of Classification Search .......... 257/288, 257/314, 315, 316; 438/264, 296, 381, 382
See application file for complete search history.

(56) References Cited

U.S. PATENT DOCUMENTS

| 6,482,658 | B2 * | 11/2002 | Kang et al. ......... 438/3 |
| 6,646,303 | B2 | 11/2003 | Satoh et al. |
| 7,072,208 | B2 * | 7/2006 | Min et al. ......... 365/171 |
| 7,256,459 | B2 | 8/2007 | Shino |
| 7,306,552 | B2 * | 12/2007 | Choi et al. ......... 438/381 |
| 7,423,310 | B2 * | 9/2008 | Verhoeven ......... 257/308 |

FOREIGN PATENT DOCUMENTS

| JP | 5-82467 | 4/1993 |
| JP | 2001-111013 | 4/2001 |

OTHER PUBLICATIONS

Japanese Office Action with English translation dated Dec. 14, 2010 in Japanese Patent Application No. 2005-291231, 5 pages.

* cited by examiner

*Primary Examiner* — Phuc T Dang
(74) *Attorney, Agent, or Firm* — Oblon, Spivak, McClelland, Maier & Neustadt, L.L.P.

(57) ABSTRACT

The semiconductor device of the present invention includes a semiconductor substrate, a plurality of floating gate electrodes formed in a memory cell forming region of the semiconductor substrate, a word line electrically connecting the floating gate electrodes and a conductor portion formed on the word line so as to reduce a resistance of the word line.

8 Claims, 13 Drawing Sheets

SEMICONDUCTOR DEVICE

CROSS-REFERENCE TO RELATED APPLICATIONS

This application is a continuation and claims the benefit of priority under 35 U.S.C. §120 from U.S. application Ser. No. 11/538,272 filed on Oct. 3, 2006, now U.S. Pat. No. 7,615,818, and claims the benefit of priority under 35 U.S.C. §119 of Japanese Patent Application No. 2005-291231 filed on Oct. 4, 2005, the entire contents of which are incorporated herein by reference.

BACKGROUND OF THE INVENTION

1. Field of Invention

The present invention is directed to a semiconductor device having a memory array comprising a word line with reduced resistance and a method of manufacturing the same.

2. Description of the Related Art

Nowadays, semiconductor devices are subject to increasing demands to shrink the design rules. To meet such demands, semiconductor devices, typically a flash memory employing a NOR memory cell region requires narrower spaces between the word lines of each memory cell. This leads to increase in the aspect ratio, indicative of the relation of word line height relative to word line gap, thus increasing the difficulty of filling the spaces between the word lines with insulating films.

The following problems are observed in NOR flash memories, particularly in NOR flash memories of a substrate erase type that form multiple silicon substrate contacts between the word lines. In the event a void occurs in the material filling the spaces between the word lines, a leak path is generated between the neighboring contacts via the void, thereby shorting the neighboring contacts and ultimately resulting in defective cells. To reduce the aspect ratio upon filling the word line spaces, a method may be employed in which the word line height is lowered by reducing the thickness of the word line. However, thinning the word line will result in the reduction of cross-sectional area taken in the direction of the conductive path of the word line, which in turn increases the resistance of the word line and possibly reduce the read speed of the memory cell. Such aspect is a negative factor in employing this method.

JP-A-H05-82467 discloses a conventional method to overcome the difficulty of forming contact holes imposed by design rule shrink. The disclosure indicates a method of reliably defining the contact holes in different vertical positions by arranging either of the contact holes in a rectangular profile.

The disclosed construction may prevent the increase of resistance of the contact holes but is yet unsuccessful in reducing the electrical conductivity of the word line itself.

BRIEF SUMMARY OF THE INVENTION

Therefore, an object of the present invention is to provide a semiconductor device having a memory cell comprising a word line with reduced resistance and a method of manufacturing the same.

The semiconductor device of the present invention includes a semiconductor substrate, a plurality of floating gate electrodes formed in a memory cell region of the semiconductor substrate, a word line electrically connecting the floating gate electrodes, and a conductor portion formed on the word line so as to reduce a resistance of the word line.

The method of manufacturing the semiconductor device of the present invention involves forming an element isolation region and gate electrodes for a plurality of memory cell transistors on a semiconductor substrate, forming planarized interconnect insulating film that cover the gate electrodes, opening the interconnect insulating film overlaying the gate electrode constituting the word line formed so as to span over the plurality of memory cells and the interconnect insulating film in a portion of a drain and a source of the plurality of memory cell transistors, and forming a conductor portion on the word line by filling the opened portion of the interconnect insulating film with a conductive material as well as forming a drain contact in the drain and a source line in the source of the memory cell.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE PREFERRED EMBODIMENT

The first embodiment applying the present invention to a NOR flash memory will be explained with reference to FIGS. 1 to 15.

Figure 1:
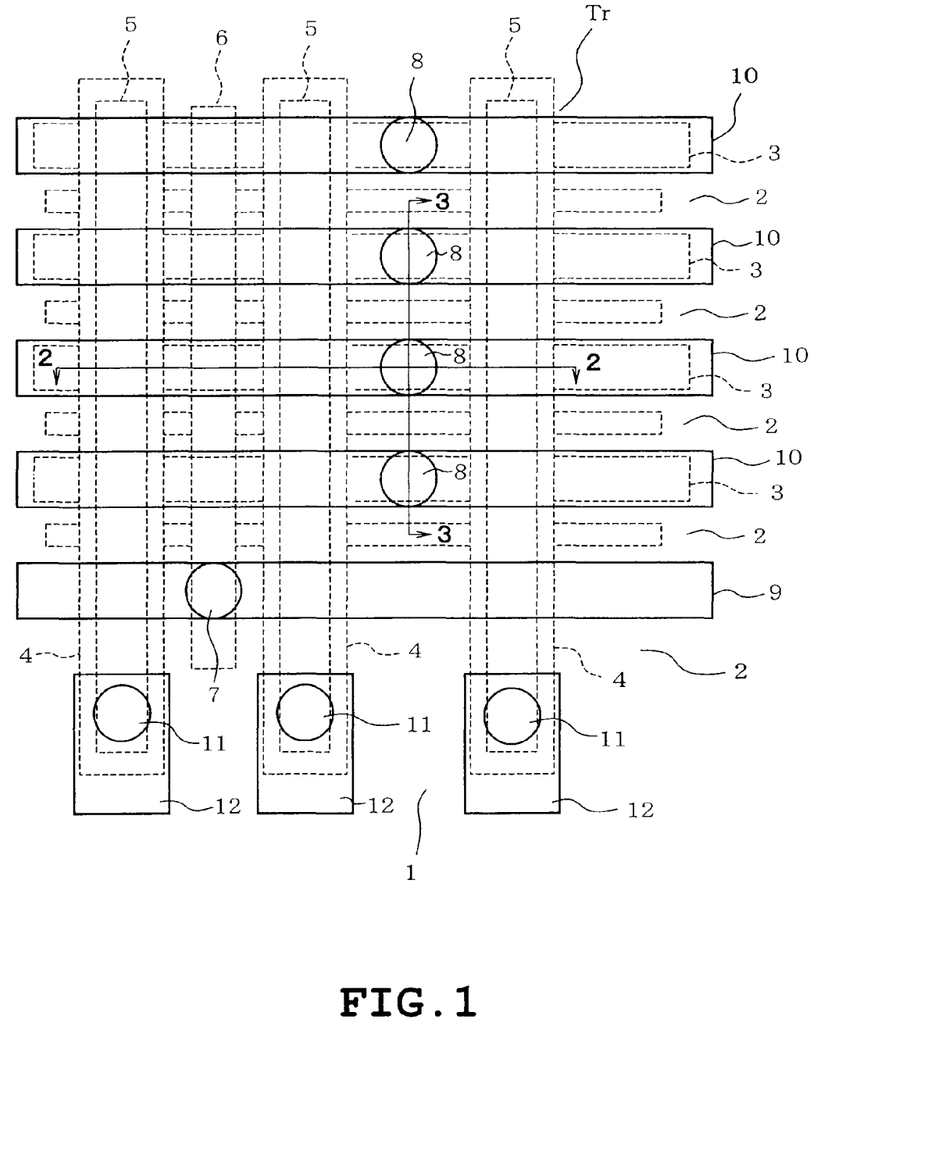
FIG. 1 is a schematic view of a first embodiment of the present invention.
Figure 2:
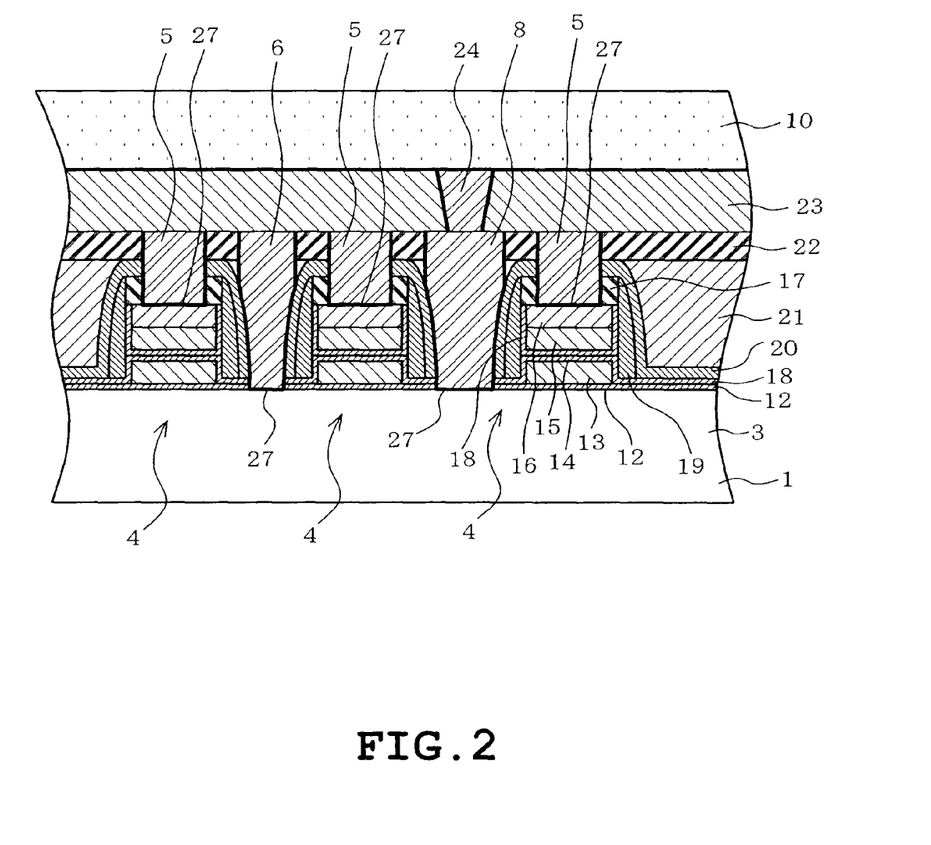
FIG. 2 is a schematic cross sectional view taken along line 2-2 in FIG. 1.
Figure 3:
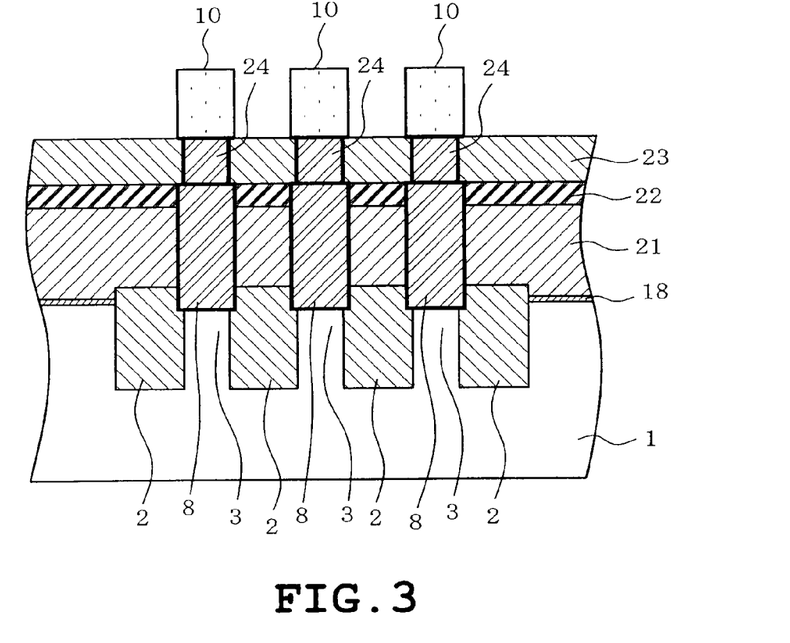
FIG. 3 is a schematic cross sectional view taken along line 3-3 in FIG. 2.

FIG. 1 is a plan view of a memory cell region and FIGS. 2 and 3 indicate cross sectional views taken along lines 2-2 and 3-3 respectively. Referring to FIG. 1, an STI (Shallow Trench Isolation) 2 functioning as an element isolation region is formed at predetermined intervals on the silicon substrate 1. An active area 3 for element formation is defined on the surface of the silicon substrate 1 functioning as a semiconductor substrate by being isolated by the STI 2.

A gate electrode 4 is formed so as to intersect the active region 3 and the STI 2. The gate electrode 4 is constituted by a layer of floating gate electrode and a layer of control gate electrode, wherein the control gate electrode is stacked on the floating gate electrode. The gate electrode 4 serves as a word line. Defined on the upper surface of the gate electrode 4 is a recess, formed by opening the insulating film, accommodating therein a trench interconnect 5 serving as an conductor portion comprising W (tungsten) as will be described afterwards.

Impurities are doped in the active region 3 interposing the neighboring gate electrodes 4. FIG. 1 exemplifies a transistor in which the narrower active region 3 in the left side serves as a source region and the wider active region 3 in the right side serves as a drain region. The memory transistors are electrically connected by a source line 6 formed in the source region. A contact 7 is formed on one end of the source line 6, whereas a drain contact 8 is formed in the drain region of each memory transistor. The contact 7 of the source line 6 is electrically connected to an interconnect pattern 9 formed in the lateral direction of FIG. 1 in alignment with the active region 3. The drain contact 8 is electrically connected to a bit line 10. The gate electrode 4 also has a gate contact 11 formed on the end thereof to which an interconnect pattern 12 is electrically connected.

Referring to FIG. 2 illustrating the cross section of the portion taken along line 2-2 in FIG. 1, a description will be given on the detailed construction of the gate electrode 4 formed on the upper surface of the silicon substrate 1. A gate oxide film 12, a polycrystalline silicon film 13 constituting the floating gate electrode, an ONO (Oxide-Nitride-Oxide) film 14, and a polycrystalline silicon film 15 and a WSi (tungsten silicide) 16 constituting the control gate electrode are stacked on the silicon substrate 1 sequentially. A silicon oxide film, for example, a TEOS (Tetraethyl Orthosilicate) oxide film 17 is formed on the upper surface of the WSi film 16. An opening is defined in the TEOS oxide film 17 and the opening is filled with the trench interconnect 5. A silicon oxide film 18 is formed on the side wall of the gate electrode 4 so as to serve as an oxide film. A side wall spacer 19 is further formed on the side wall of the gate electrode 4 and a silicon nitride film 20 is formed so as to cover the side wall spacer 19.

A BPSG (boro-phospho-silicate glass) film 21 serving as an interconnect insulating film is embedded between the neighboring gate electrodes 4 and a TEOS oxide film 22 is further formed over the BPSG film 21. The aforementioned trench interconnect 5, the source line 6 and the drain contact 8 are formed with the BPSG film 21 and the TEOS oxide film 22 in opened state.

A TEOS oxide film 23 is stacked further on top of the foregoing and defined therein is a via 24 for establishing electrical connection with the trench interconnect 5, the source line 6 and the drain contact 8 respectively (FIG. 2 illustrates via 24 associated with drain contact 8). A bit line 10 shown in FIG. 2 establishing an electric connection with the via 24 is formed by patterning a metal interconnect layer.

Referring to FIG. 3 indicating a cross section of a portion taken along line 3-3 of FIG. 1, STI 2 is defined at predetermined intervals in the silicon substrate 1, whereby the active regions 3 are isolated from each other. The portion illustrated in FIG. 3 has no gate electrode 4 and is occupied by the BPSG film 21 and the TEOS oxide film 22 serving as interlayer insulating films. The drain contact 8 is embedded in the interlayer insulating film. A TEOS oxide film 23 is formed over the foregoing and the via 24 is embedded into the drain contact 8 portion. Furthermore, bit lines 10 are patterned so as to be electrically connected to each via 24.

In the above construction, the trench interconnect 5 made of conductive material such as W (tungsten) is embedded in the word line, in other words, the gate electrode 4. Thus, the increase of electrical resistance is restrained and the electrical property of the device is improved regardless of pattern shrinking imposed by integration.

Figure 4:
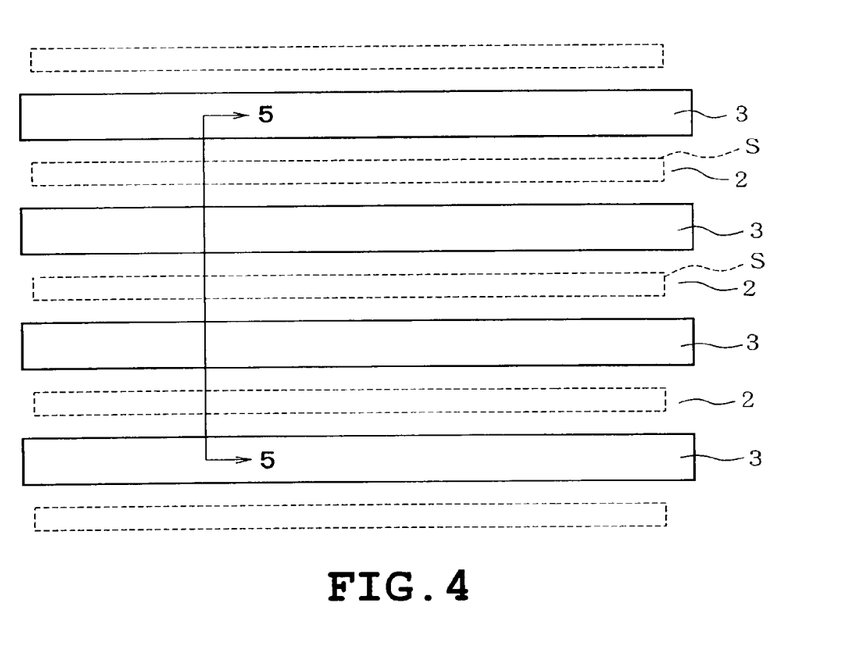
FIG. 4 corresponds to FIG. 1 and shows one phase of manufacturing process.
Figure 5:
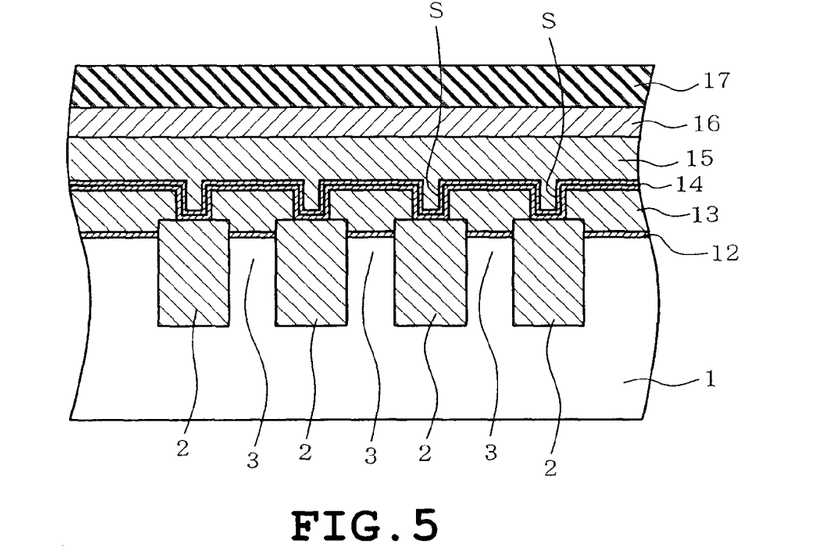
FIG. 5 corresponds to FIG. 3 and shows one phase of manufacturing process.
Figure 6:
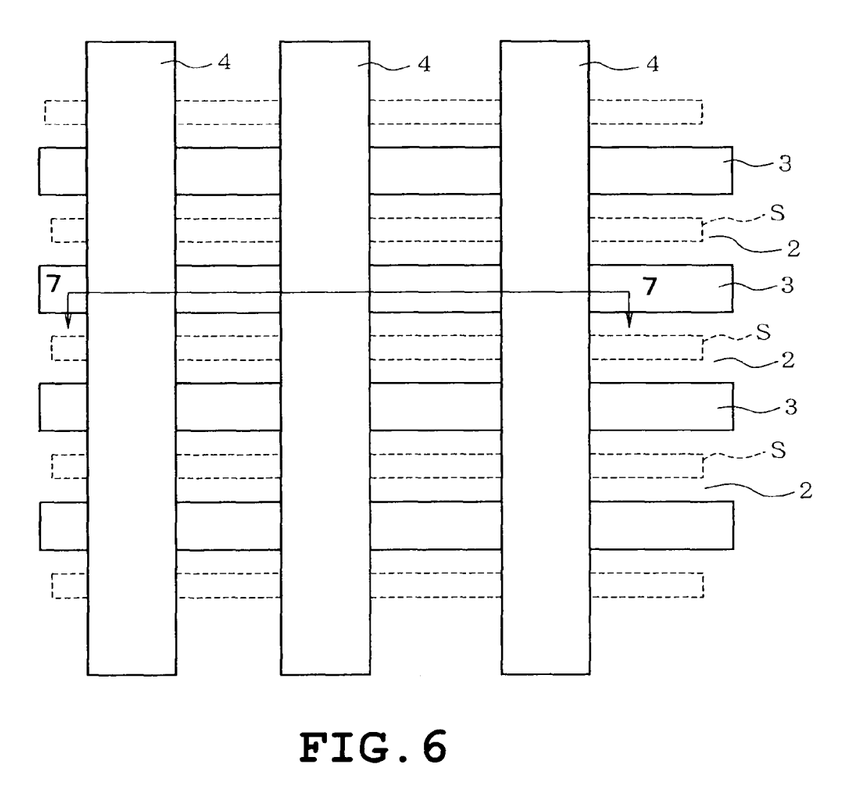
FIG. 6 corresponds to FIG. 1 and shows one phase of manufacturing process.

Next, the manufacturing process of the above construction is described with reference to FIGS. 4 to 15. FIG. 5 indicates a cross section taken along line 5-5 of a plan view illustrated in FIG. 4. The construction illustrated in this figure is formed by employing a method in which the gate is formed in advance as follows. First, a gate oxide film 12 functioning as a tunnel oxide film is formed on the silicon substrate 1. Then the lower layer portion of the polycrystalline silicon 13 is formed, whereupon a silicon nitride film not shown is formed. Subsequently, the silicon nitride film, the polycrystalline silicon film 13, and the gate oxide film 12 are etched and the silicon substrate 1 is further etched down to a predetermined depth, thereby to define a trench.

Successively, the trench is filled with an insulating film to form the STI 2. The insulating film filling the trench is planarized by CMP (Chemical Mechanical Polishing) process whereafter the silicon nitride film is etched away. Thereafter, the upper layer portion of the polycrystalline film 13 is formed and is patterned to define a slit S in a portion over the STI 2. After forming the ONO film 14, the polycrystalline silicon film 15 and the WSi film 16 constituting the control gate electrode are formed in the thickness on the order of 100 nm. Then, the TEOS oxide film 17 serving as a hard mask for processing the gate electrode is formed in the thickness on the order of 200 nm. The constructions illustrated in FIGS. 4 and 5 are obtained by the foregoing process.

Figure 7:
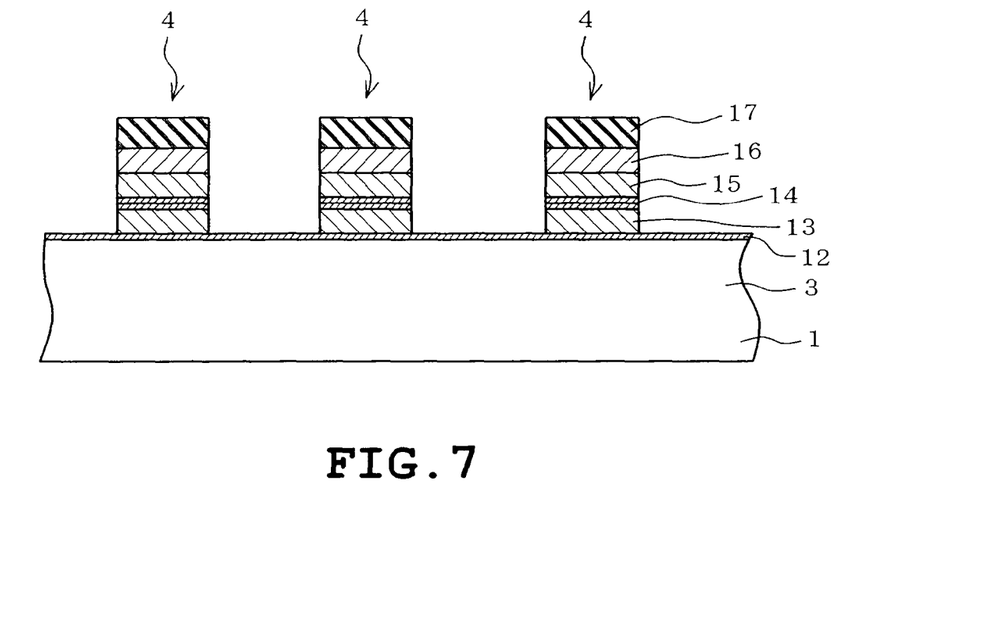
FIG. 7 corresponds to FIG. 2 and shows one phase of manufacturing process.

Next, as shown in FIG. 7, photolithography process is carried out from the above state in which a photoresist coat is applied and patterned to shape the gate electrode 4. Then, the TEOS oxide film 17 is processed by dry etch process. The WSi film 16 and the polycrystalline silicon film 15 in the cell region are subsequently removed by using the TEOS oxide film 17 as a hard mask, whereafter the ONO film 14 and the polycrystalline silicon film 13 are removed by dry etch process. Thus, a stacked gate structure constituting the gate electrode is formed by the foregoing process.

Subsequently, thermal oxidation is carried out from the above state to form a silicon oxide film 18 serving as a post-oxidation film on the side wall of the gate electrode 4. Then, a photoresist is patterned by photolithography process and ion implantation is performed to form an impurity diffusion layer required for forming memory transistors and peripheral transistors.

Figure 8:
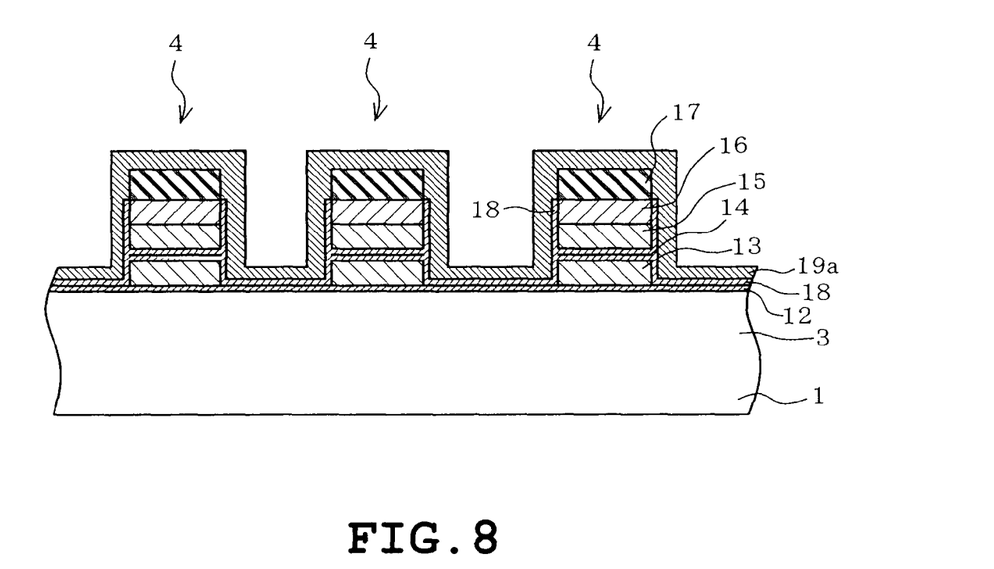
FIG. 8 corresponds to FIG. 2 and shows one phase of manufacturing process.
Figure 9:
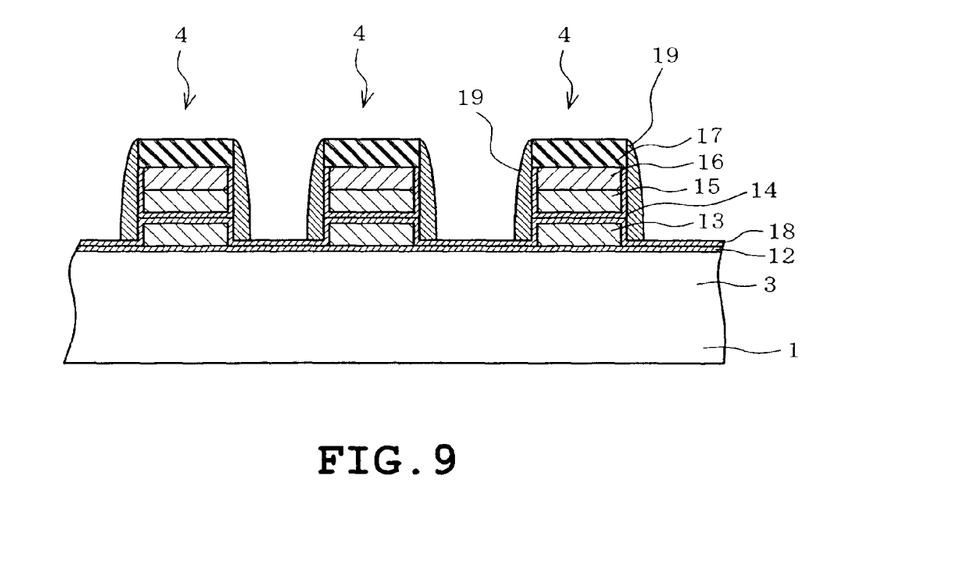
FIG. 9 corresponds to FIG. 2 and shows one phase of manufacturing process.

Next, as shown in FIG. 8, a silicon nitride film 19a is deposited to a predetermined thickness from the above state and etched back to form a sidewall spacer 19 as illustrated in FIG. 9. Successively, LDD (Lightly Doped Drain) structure is formed by performing ion implantation required for forming highly doped diffusion layer of the cell.

Figure 10:
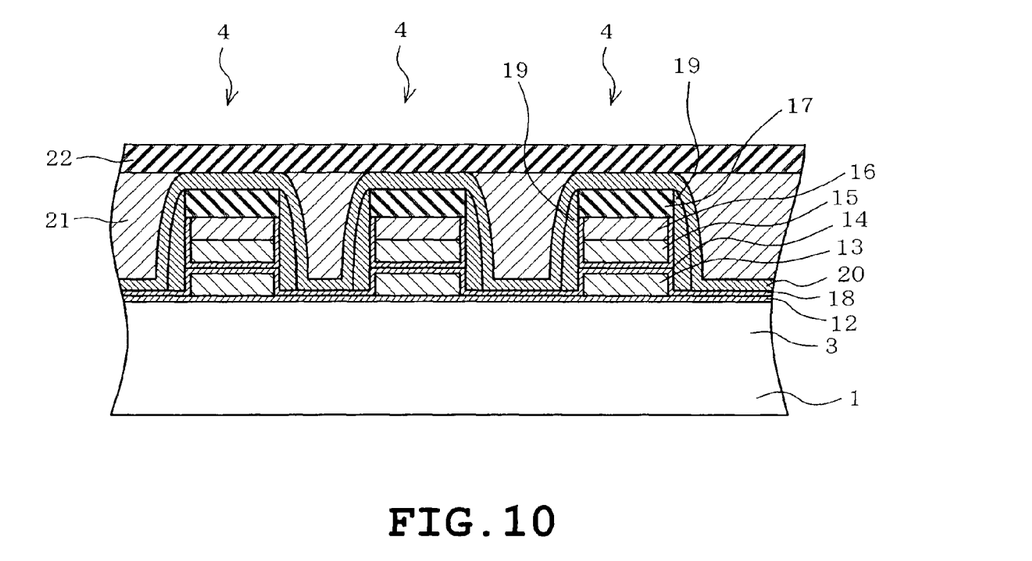
FIG. 10 corresponds to FIG. 2 and shows one phase of manufacturing process.

As shown in FIG. 10, a silicon nitride film 20 functioning as a stopper upon opening a contact is subsequently deposited on the order of 40 nm, whereupon the BPSG film 21 functioning as an interlayer insulating film is formed. Then, after reflow, the BPSG film 21 is planarized by CMP process. Thereafter, the TEOS oxide film 22 is stacked in the thickness of, for instance, 250 nm.

Figure 11:
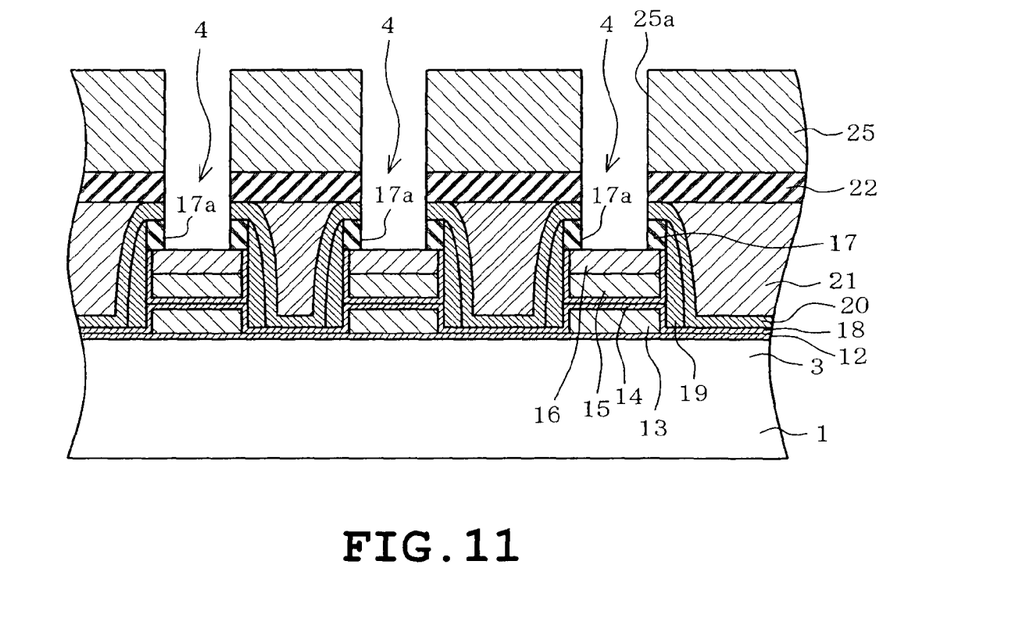
FIG. 11 corresponds to FIG. 2 and shows one phase of manufacturing process.

Next, as shown in FIG. 11, a recess for accommodating the trench interconnect 5 is formed by the following process. First, a photoresist 25 is coated and patterned by photolithography process to define an opening 25a on the upper portion of the gate electrode 4, in other words, the word line. Then a contact hole 17a is defined by etching the TEOS oxide film 22, silicon nitride film 20 and TEOS oxide film 17 so as to expose the upper surface of the WSi film 16.

Figure 12:
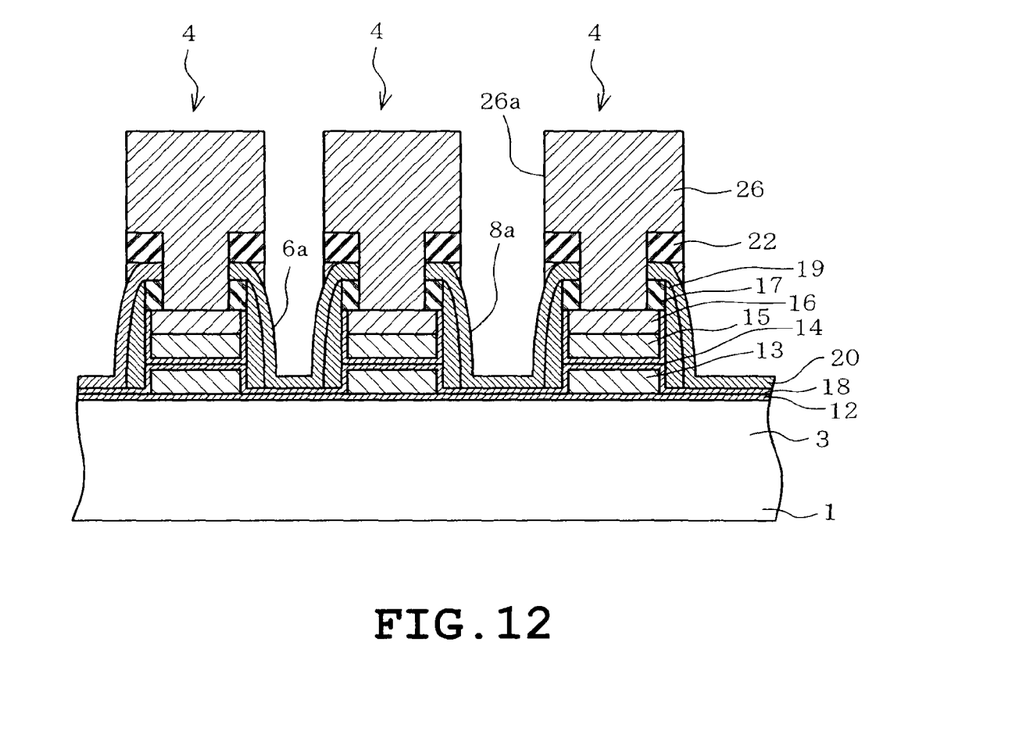
FIG. 12 corresponds to FIG. 2 and shows one phase of manufacturing process.

Thereafter, as shown in FIG. 12, a photoresist 26 is coated and patterned by photolithography process to define an opening 26a for forming a contact hole 6a for a source line 6 and a contact hole 8a for drain contact 8. Then the silicon nitride film 20 serving as an etch stopper is exposed by the etch process performed thereafter. Subsequently, the photoresist 26 is removed and the silicon nitride film 20, the silicon oxide film 18 and the gate oxide film 12 are etched away to expose the active region 3 of the silicon substrate 1 thus, forming the contact holes 6a and 8a.

Figure 13:
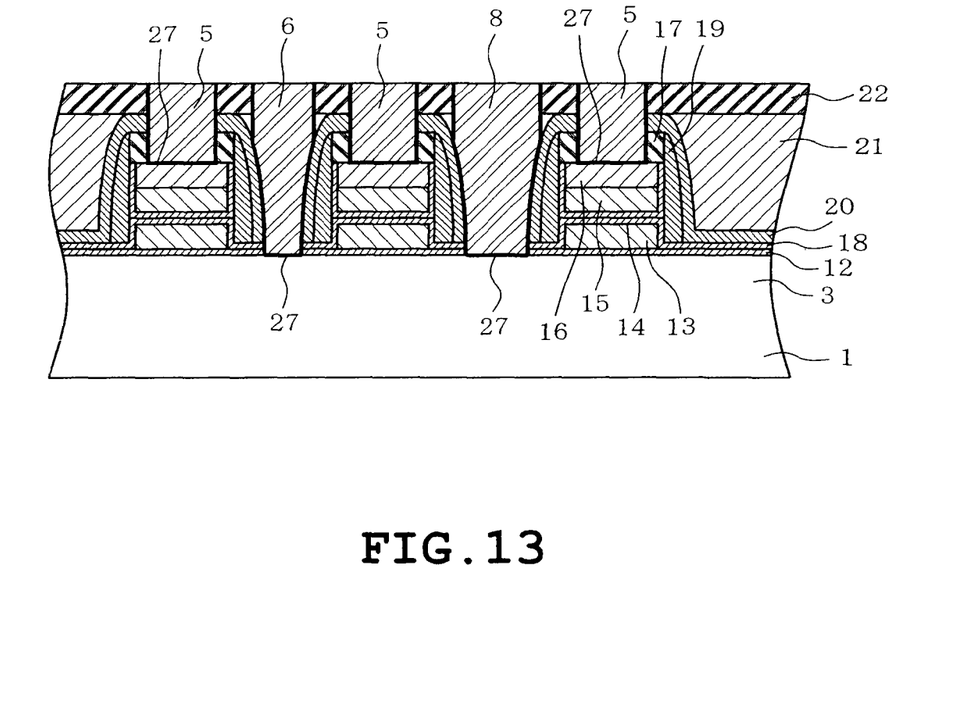
FIG. 13 corresponds to FIG. 2 and shows one phase of manufacturing process.

Next, Ti and TiN are stacked to form a barrier metal 27 with the contact holes 5a, 6a, and 8a opened. At this time, the Ti film and the TiN film are formed by sputter process in the film thickness of 20 nm and 10 nm respectively. Subsequently, as shown in FIG. 13, a W film constituting the interconnecting material is stacked to fill each contact holes 5a, 6a and 8a and is thereafter planarized by CMP process by removing the W film and the barrier metal 27 in the portions other than the contact holes. The trench interconnect 5, the source line 6, and the drain contact 8 are thus formed.

Figure 14:
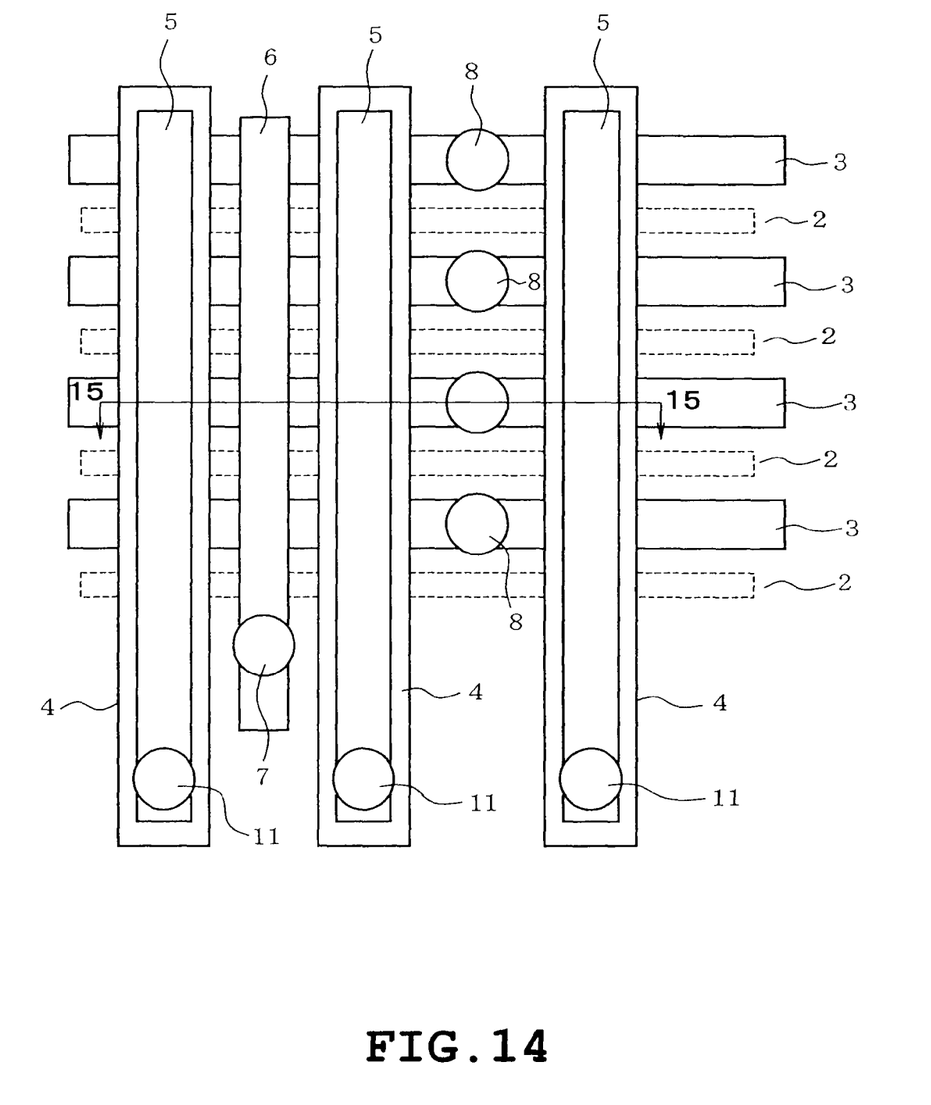
FIG. 14 corresponds to FIG. 1 and shows one phase of manufacturing process.
Figure 15:
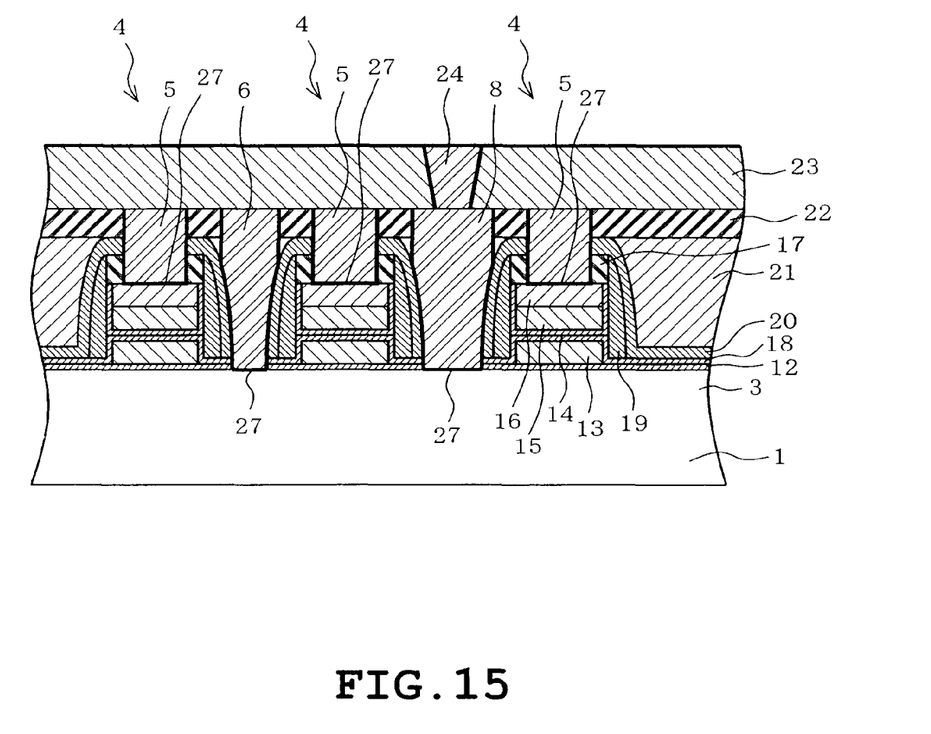
FIG. 15 corresponds to FIG. 2 and shows one phase of manufacturing process.

Next, as shown in FIGS. 14 and 15, the TEOS oxide film 23 is deposited and via holes connecting to the word line with the trench interconnect 5 formed thereto; the source line 6 of the cell; and the drain contact 8 illustrated in the figures are patterned respectively. The via holes are thereafter opened by way of dry etch. Successively, TiN film constituting the barrier metal is deposited, whereupon a W film constituting the interconnect material is further deposited. The W film and TiN film are thereafter removed by CMP process to form the via 24 and other vias.

Further, interconnect patterns 9, 10, and 12 illustrated in FIGS. 1 and 2, for example, are formed by patterning the stacked metal interconnect layer. The LSI manufacturing process is completed by defining an opening on a pad after an upper interconnect layer and a passivation layer is formed in the subsequent step.

According to the above described embodiment, since the trench interconnect 5 is filled in the word line, that is, the gate electrode 4, electrical property of the device can be improved by restraining the increase of electrical resistance regardless of the shrinking of word line pattern imposed by integration. The above described construction can be manufactured reliably under stable conditions since it does not require any particular steps.

In the above described embodiment, as shown in FIGS. 11 and 12, photolithography processes for forming contact holes for the word line trench interconnects 5 and for forming source line drain contacts have been explained as being performed in separate steps. However, the same can be achieved in a single step by employing photoresist double exposure technique for forming the patterns and defining the openings.

Figure 16:
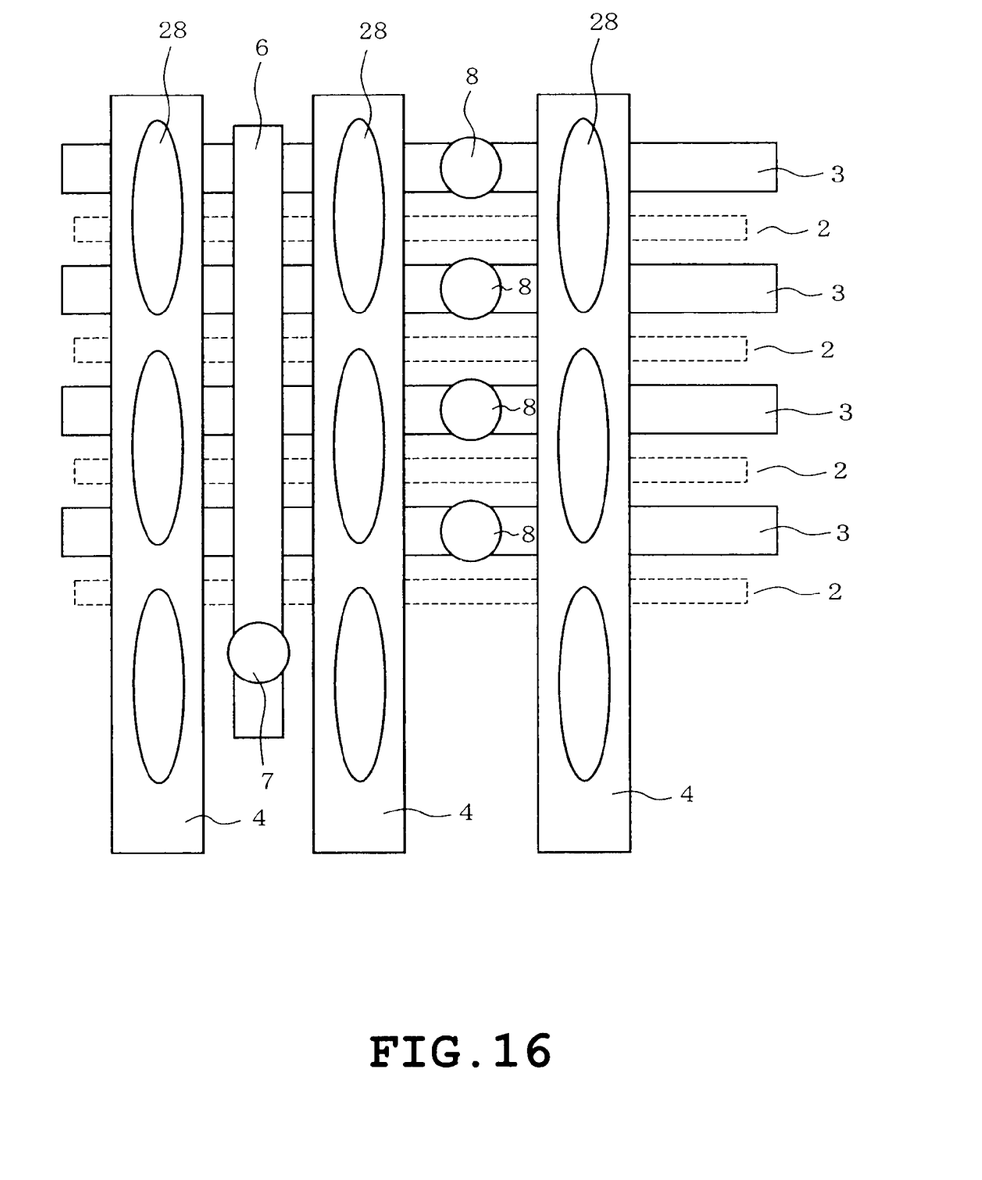
FIG. 16 corresponds to FIG. 2 and illustrates a second embodiment of the present invention.
Figure 17:
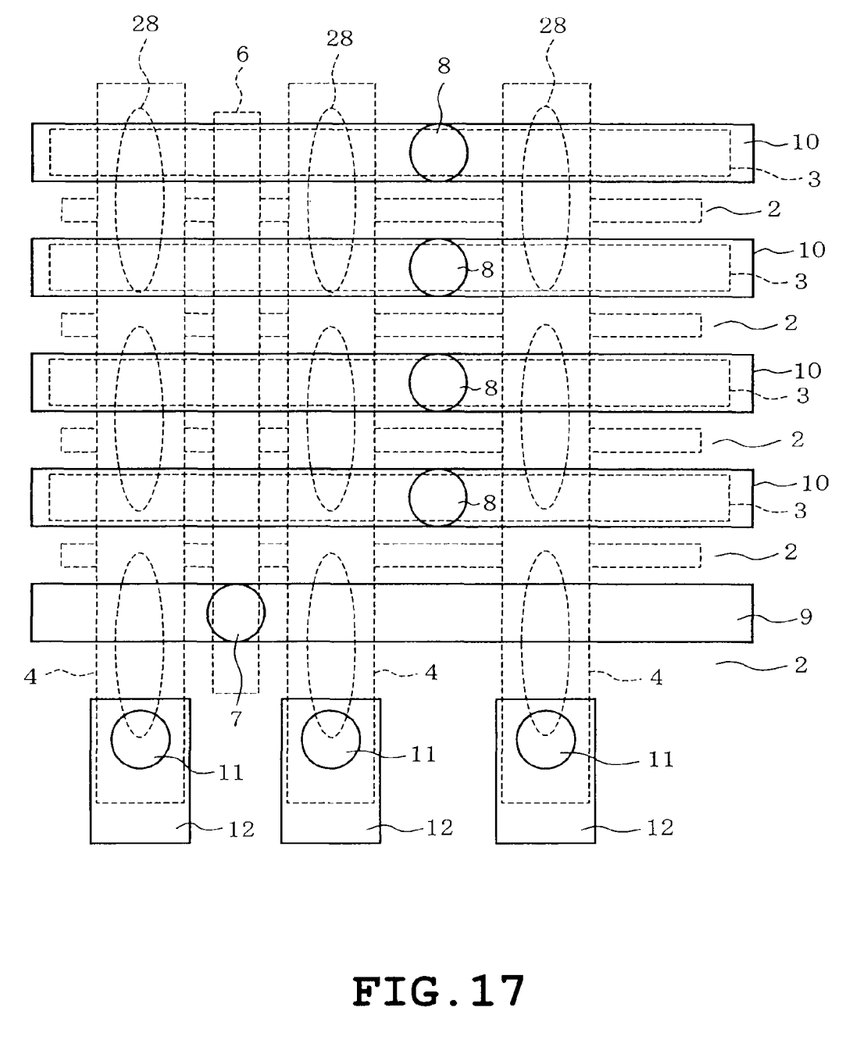
FIG. 17 corresponds to FIG. 16.

FIGS. 16 and 17 illustrate the second embodiment of the present invention. The portions that differ from the first embodiment will be described hereinafter.

As shown in FIGS. 16 and 17, instead of the rectangular trench interconnect 5 constituting a conductive material that conforms to the shape of the gate electrode 4 functioning as the word line, the present embodiment employs an ellipse trench interconnect 28. In such case, the shape of the trench interconnect 28 differs form the trench interconnect 5 and is not elongated along the word line but is in an ellipse form merely spanning over several active regions 3, for example two neighboring active regions 3. Plurality of such trench interconnects 28 is disposed at predetermined intervals along the word line.

The manufacturing steps for the above construction are substantially the same as the first embodiment pursuing the same steps up to the stacking of the TEOS oxide 17 shown in FIG. 10. The shape pattern of the opening defined in the TEOS oxide film 17 of the gate electrode 4 constituting the word line as shown in FIG. 11 takes on an ellipse form as shown in FIG. 16. The subsequent steps follow those of the first embodiment.

The above construction also provides effects similar to the first embodiment. The employment of the elongated ellipse trench interconnect 28 provides better patternability and processability as compared to a circular pattern in the photolithograpy process step as well.

Figure 18:
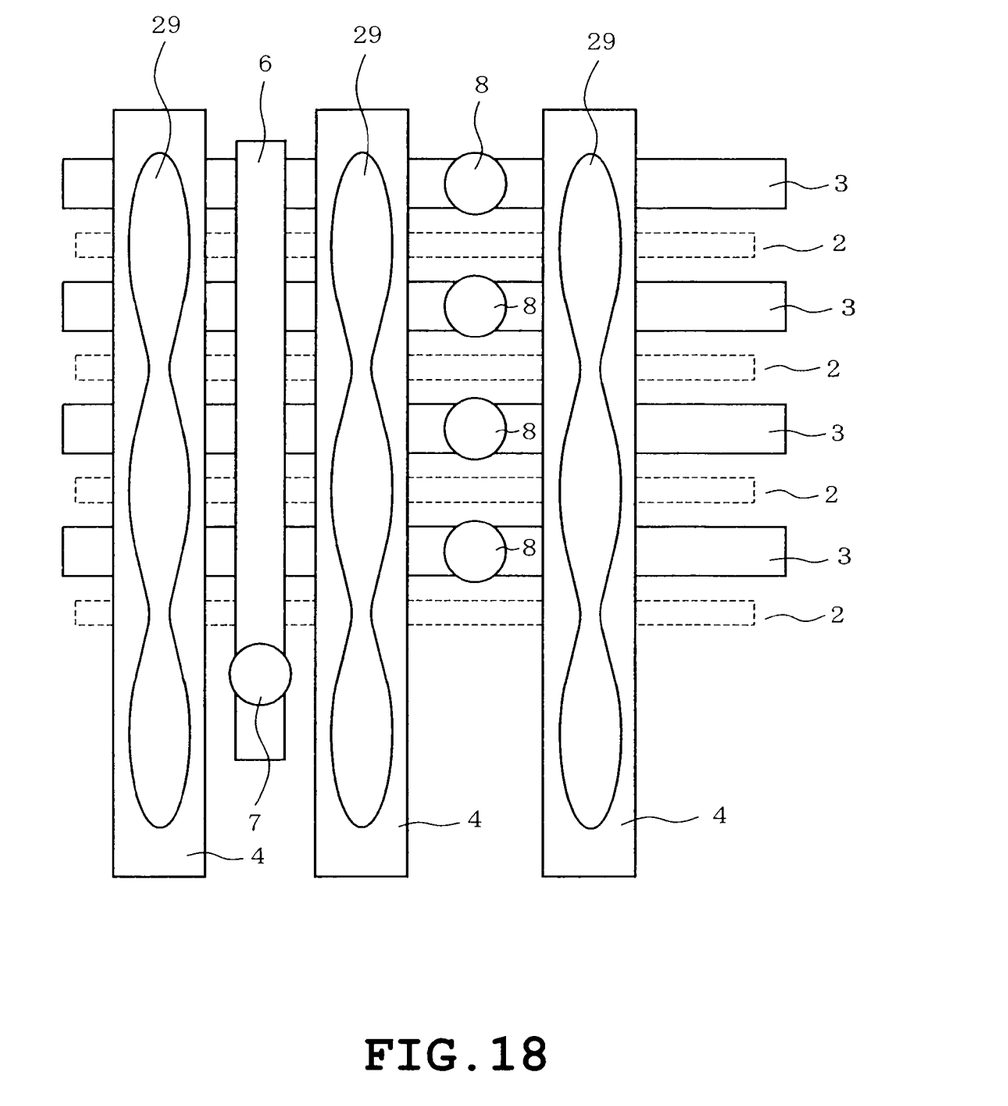
FIG. 18 corresponds to FIG. 1 and illustrates a third embodiment of the present invention.

FIG. 18 illustrates a third embodiment of the present invention, varying from the second embodiment in that a trench interconnect 29 is employed instead of the trench interconnect 28 constituting the conductor portion. The trench interconnect 29 of the present embodiment takes on a shape in which the trench interconnects 28 are linked together.

The trench interconnect 29 shaped as described above incorporates the features of both first and the second embodiments thereby to provide the same operation and effect. Also, the trench interconnect 29 secures insulativity by the increased distance between the drain contact and the source line of the cell transistor as compared with the trench interconnect 5 of the first embodiment; and moreover provides reduced word line resistance as compared with the second embodiment.

The present invention is not limited to the above embodiments but can be modified or expanded as follows.

The trench interconnect 28 in the second embodiment assuming an elongated ellipse form is subject to modifications such as the change in the aspect ratio. More specifically, the length taken along the word line may be further increased.

Also, the trench interconnect 28 in the second embodiment assuming an elongated ellipse form may be replaced by other oblong forms such as a rectangular form having the same aspect ratio.

The foregoing description and drawings are merely illustrative of the principles of the present invention and are not to be construed in a limited sense. Various changes and modifications will become apparent to those of ordinary skill in the art. All such changes and modifications are seen to fall within the scope of the invention as defined by the appended claims.

We claim:

1. A semiconductor device comprising:
    a semiconductor substrate;
    a plurality of floating gate electrodes formed in a memory cell forming region on the semiconductor substrate;
    a word line formed along a direction and having a first width electrically connecting the floating gate electrodes; and
    a conductor portion having a second width narrower than the first width formed directly on the word line along the direction to reduce a resistance of the word line.

2. The semiconductor device according to claim 1, wherein the word line includes an upper portion and a trench defined on the upper portion, and wherein the conductor portion is filled in the trench.

3. The semiconductor device according to claim 1, wherein the conductor portion comprises a rectangular shape formed on the word line.

4. The semiconductor device according to claim 1, wherein the conductor portion comprises a plurality of ellipse conductor portions formed on the word line.

5. The semiconductor device according to claim 4, wherein the conductor portion is formed in a shape in which the plurality of ellipse conductor portions are linked together.

6. The semiconductor device according to claim 1, wherein the conductor portion is made of tungsten.

7. The semiconductor device according to claim 1, wherein the conductor portion is made of a barrier metal and tungsten.

8. The semiconductor device according to claim 1, wherein the conductor portion extends across at least two memory cells along the direction.

* * * * *